United States Patent
Syouda et al.

(10) Patent No.: US 12,136,838 B2
(45) Date of Patent: Nov. 5, 2024

(54) STORAGE BATTERY CONTROL DEVICE, STORAGE BATTERY SYSTEM AND STORAGE BATTERY CONTROL METHOD

(71) Applicant: YAZAKI CORPORATION, Tokyo (JP)

(72) Inventors: Takahiro Syouda, Susono (JP); Chihiro Ono, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 530 days.

(21) Appl. No.: 17/673,765

(22) Filed: Feb. 16, 2022

(65) Prior Publication Data

US 2022/0294235 A1   Sep. 15, 2022

(30) Foreign Application Priority Data

Mar. 15, 2021 (JP) .................................. 2021-041768

(51) Int. Cl.
  *H02J 7/00* (2006.01)
  *G01R 31/3842* (2019.01)
  *G01R 31/396* (2019.01)

(52) U.S. Cl.
  CPC ........ *H02J 7/0016* (2013.01); *G01R 31/3842* (2019.01); *G01R 31/396* (2019.01); *H02J 7/0025* (2020.01); *H02J 7/0048* (2020.01)

(58) Field of Classification Search
  CPC .................................................... H02J 7/0016
  USPC ...................................................... 320/116
  See application file for complete search history.

(56) References Cited

U.S. PATENT DOCUMENTS

| | | | |
|---|---|---|---|
| 2005/0212481 A1* | 9/2005 | Nakada | H02J 7/0019 320/116 |
| 2009/0102421 A1* | 4/2009 | Imai | H02J 7/0014 320/122 |
| 2010/0237829 A1* | 9/2010 | Tatebayashi | H01M 10/441 320/118 |
| 2016/0105042 A1 | 4/2016 | Taylor et al. | |

(Continued)

FOREIGN PATENT DOCUMENTS

| | | |
|---|---|---|
| JP | H08-19188 A | 1/1996 |
| JP | 2013-31249 A | 2/2013 |
| JP | 2017-531983 A | 10/2017 |

*Primary Examiner* — Jerry D Robbins
(74) *Attorney, Agent, or Firm* — KENEALY VAIDYA LLP

(57) ABSTRACT

A storage battery control device is configured to control a storage battery system including storage batteries connected in series and a bypass circuit configured to selectively bypass each of the storage batteries. The storage battery control device includes: a processor; and a memory having instructions that, when executed by the processor, cause the storage battery control device to perform operations including: performing a first process of causing the bypass circuit to preferentially bypass, among the storage batteries, a storage battery having a smaller remaining charge amount until completion of charging than those of the other storage batteries, and charging at least one of the storage batteries such that a difference in remaining charge amounts of the storage batteries until completion of charging is reduced; and performing, after the first process, a second process of charging the storage batteries until the charging is completed.

5 Claims, 6 Drawing Sheets

(56) References Cited

U.S. PATENT DOCUMENTS

| | | | |
|---|---|---|---|
| 2018/0337536 A1* | 11/2018 | Li | ........................... H02J 7/00 |
| 2019/0319460 A1 | 10/2019 | Taylor et al. | |
| 2020/0259338 A1 | 8/2020 | Taylor et al. | |
| 2020/0321788 A1* | 10/2020 | Ono | ...................... H02J 7/0019 |
| 2021/0075230 A1 | 3/2021 | Ono et al. | |
| 2021/0359527 A1 | 11/2021 | Taylor et al. | |

* cited by examiner

FIG. 3

| CELL | t0 | t0-t1 | | t1-t2 | | t2-t3 | | t3-t4 | | t4-t5 | | t5-t6 | | t6-t7 | | t7-t8 | |
|---|---|---|---|---|---|---|---|---|---|---|---|---|---|---|---|---|---|
| | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] |
| C1 | 100 | 86 | 14 | 1 | 13 | 2 | 11 | 1 | 10 | 5 | 5 | 3 | 2 | 1 | 1 | 1 | 0 |
| C2 | 99 | 86 | 13 | 1 | 12 | 2 | 10 | 1 | 9 | 5 | 4 | 3 | 1 | 1 | 0 | 0 | 0 |
| C3 | 98 | 86 | 12 | 1 | 11 | 2 | 9 | 1 | 8 | 5 | 3 | 3 | 0 | 0 | 0 | 0 | 0 |
| C4 | 95 | 86 | 9 | 1 | 8 | 2 | 6 | 1 | 5 | 5 | 0 | 0 | 0 | 0 | 0 | 0 | 0 |
| C5 | 90 | 86 | 4 | 1 | 3 | 2 | 1 | 0 | 0 | 0 | 0 | 0 | 0 | 0 | 0 | 0 | 0 |
| C6 | 89 | 86 | 3 | 1 | 2 | 2 | 0 | 0 | 0 | 0 | 0 | 0 | 0 | 0 | 0 | 0 | 0 |
| C7 | 87 | 86 | 1 | 1 | 0 | 0 | 0 | 0 | 0 | 0 | 0 | 0 | 0 | 0 | 0 | 0 | 0 |
| C8 | 86 | 86 | 0 | 0 | 0 | 0 | 0 | 0 | 0 | 0 | 0 | 0 | 0 | 0 | 0 | 0 | 0 |

FIG. 5

| CELL | t0 | t1-t2 | | t2-t3 | | t3-t4 | | t4-t5 | | t5-t6 | |
|---|---|---|---|---|---|---|---|---|---|---|---|
| | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] | CHARGE AMOUNT [Ah] | REMAINING CHARGE CAPACITY [Ah] |
| C1 | 100 | 7 | 93 | 2 | 91 | 1 | 90 | 1 | 89 | 3 | 86 |
| C2 | 99 | 7 | 92 | 2 | 90 | 1 | 89 | 0 | 89 | 3 | 86 |
| C3 | 98 | 7 | 91 | 0 | 91 | 1 | 90 | 1 | 89 | 3 | 86 |
| C4 | 95 | 7 | 88 | 2 | 86 | 0 | 86 | 0 | 86 | 0 | 86 |
| C5 | 90 | 0 | 90 | 0 | 90 | 0 | 90 | 1 | 89 | 3 | 86 |
| C6 | 89 | 0 | 89 | 0 | 89 | 0 | 89 | 0 | 89 | 3 | 86 |
| C7 | 87 | 0 | 87 | 0 | 87 | 0 | 87 | 1 | 86 | 0 | 86 |
| C8 | 86 | 0 | 86 | 0 | 86 | 0 | 86 | 0 | 86 | 0 | 86 |

STORAGE BATTERY CONTROL DEVICE, STORAGE BATTERY SYSTEM AND STORAGE BATTERY CONTROL METHOD

CROSS-REFERENCE TO RELATED APPLICATIONS

This application is based on and claims the benefit of priority of Japanese Patent Application No. 2021-041768 filed on Mar. 15, 2021, the entire contents of which are incorporated herein by reference.

FIELD

The present disclosure relates to a storage battery control device, a storage battery system and a storage battery control method.

BACKGROUND

As a system configured to control charging of a battery device including a plurality of batteries connected in series, JP-A-2013-031249 describes a system configured to select a battery to be avoided from charging based on a state of each battery, and bypasses the battery to be avoided from charging to charge the other batteries.

SUMMARY

In the system described in JP-A-2013-031249, all the batteries can be fully charged by connecting the plurality of batteries in series to perform constant current constant voltage charging (CCCV charging), and then sequentially performing processes of bypassing a fully charged battery as the battery to be avoided from charging and performing the CCCV charging on the other batteries. However, in the end, the CCCV charging is performed on one battery while the other batteries are bypassed, which leads to a situation in which a total voltage of the system is low.

In view of the above circumstances, an object of the present disclosure is to provide a storage battery control device, a storage battery system and a storage battery control method capable of preventing a decrease in total voltage during charging in a storage battery system including a plurality of storage batteries connected in series.

The present disclosure provides a storage battery control device configured to control a storage battery system, the storage battery system including a plurality of storage batteries connected in series and a bypass circuit configured to selectively bypass each of the plurality of storage batteries, the storage battery control device including: a processor; and a memory having instructions that, when executed by the processor, cause the storage battery control device to perform operations including: performing a first process of causing the bypass circuit to preferentially bypass, among the plurality of storage batteries, a storage battery having a smaller remaining charge amount until completion of charging than those of the other storage batteries, and charging at least one of the plurality of storage batteries such that a difference in remaining charge amounts of the plurality of storage batteries until completion of charging is reduced; and performing, after the first process, a second process of charging the plurality of storage batteries until the charging is completed.

The present disclosure provides a storage battery system including: a plurality of storage batteries connected in series; a bypass circuit configured to selectively bypass each of the plurality of storage batteries; and a storage battery control device configured to control the bypass circuit, in which the storage battery control device includes: a processor; and a memory having instructions that, when executed by the processor, cause the storage battery control device to perform operations including: performing a first process of causing the bypass circuit to preferentially bypass, among the plurality of storage batteries, a storage battery having a smaller remaining charge amount until completion of charging than those of the other storage batteries, and charging at least one of the plurality of storage batteries such that a difference in remaining charge amounts of the plurality of storage batteries until completion of charging is reduced; and performing, after the first process, a second process of charging the plurality of storage batteries until the charging is completed.

The present disclosure provides a storage battery control method to be executed by using a storage battery control device, the storage battery control device being configured to control a storage battery system including a plurality of storage batteries connected in series and a bypass circuit configured to selectively bypass each of the plurality of storage batteries, the storage battery control method including: performing a first process of causing the bypass circuit to preferentially bypass, among the plurality of storage batteries, a storage battery having a smaller remaining charge amount until completion of charging than those of the other storage batteries, and charging at least one of the plurality of storage batteries such that a difference in remaining charge amounts of the plurality of storage batteries until completion of charging is reduced; and performing, after the first process, a second process of charging the plurality of storage batteries until the charging is completed.

According to the present disclosure, it is possible to prevent a decrease in total voltage during charging in a storage battery system including a plurality of storage batteries connected in series.

BRIEF DESCRIPTION OF DRAWINGS

FIG. 3 is a table illustrating the charging control in the comparative example shown in the timing chart of FIG. 2;

FIG. 5 is a table illustrating the charging control in the first embodiment of the present disclosure shown in the timing chart of FIG. 4.

DETAILED DESCRIPTION

Hereinafter, the present disclosure will be described in accordance with preferred embodiments. The present disclosure is not limited to the embodiments to be described below, and the embodiments can be changed as appropriate without departing from the gist of the present disclosure. In the embodiments to be described below, some configurations are not illustrated or described, but a known or well-known technique is applied as appropriate to details of an omitted technique within a range in which no contradiction occurs to contents to be described below.

Figure 1:
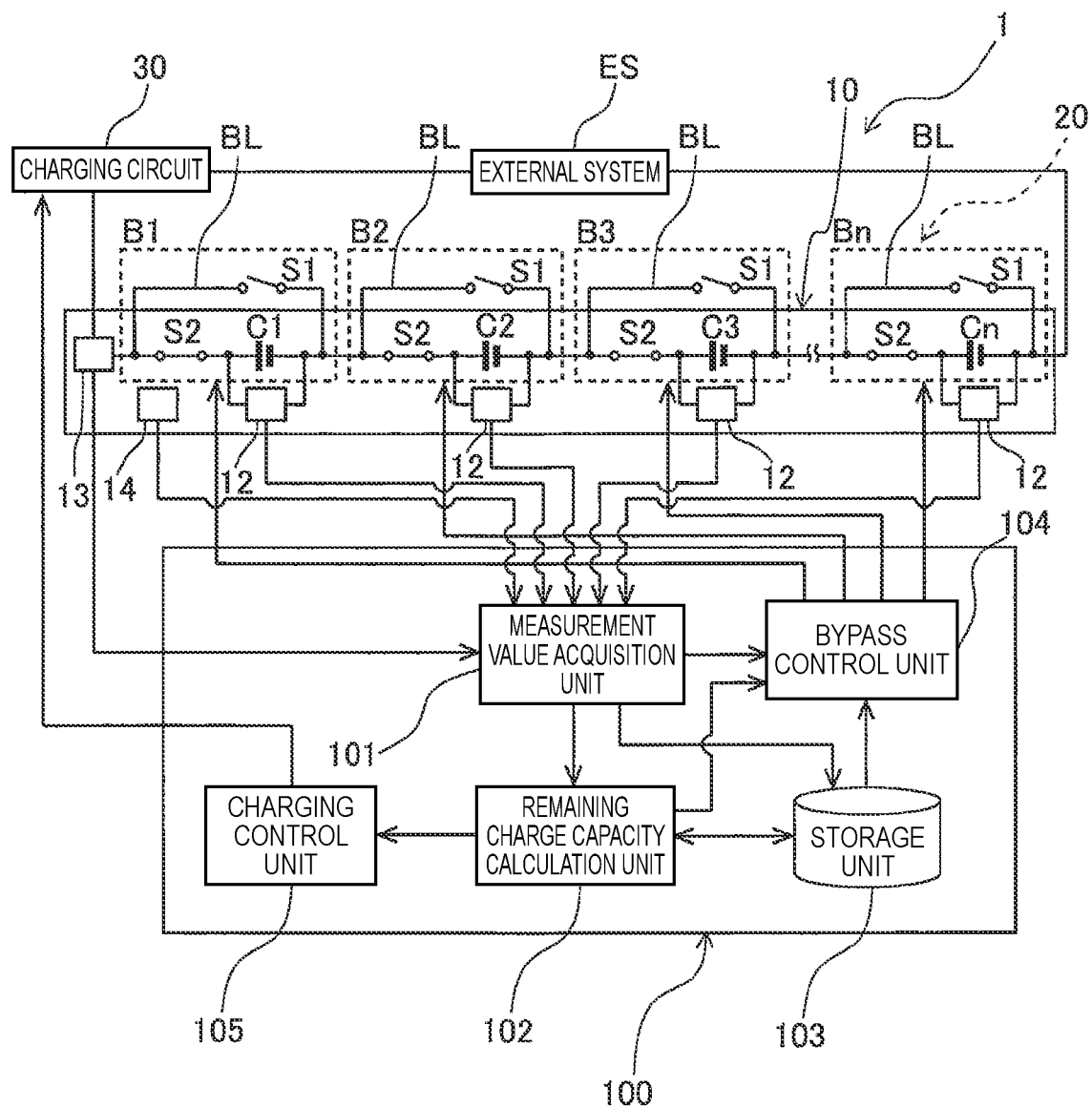
FIG. 1 is a diagram illustrating an outline of a storage battery system including a storage battery control device according to a first embodiment of the present disclosure.

FIG. 1 is a diagram illustrating an outline of a storage battery system 1 including a storage battery control device 100 according to a first embodiment of the present disclosure. As shown in this figure, the storage battery system 1 includes a storage battery pack 10, a bypass circuit 20, a charging circuit 30, and the storage battery control device 100. The storage battery pack 10 is an in-vehicle or stationary power supply including n (n is an integer of 2 or more) storage battery cells C1 to Cn connected in series. Although not particularly limited, the storage battery pack 10 in the first embodiment is obtained by regenerating used batteries, and degrees of deterioration of the storage battery cells C1 to Cn are different from each other. The storage battery cells C1 to Cn are, for example, secondary batteries such as lithium ion batteries and lithium ion capacitors, are charged by receiving a power from an external system ES through the charging circuit 30, and discharge the charged power to supply the power to the external system ES. The storage battery system 1 may include n storage battery modules or storage battery packs connected in series instead of the n storage battery cells C1 to Cn connected in series, and may include a bypass circuit that bypasses each storage battery module or each storage battery pack.

The storage battery pack 10 includes a plurality of voltage measurement units 12, a current measurement unit 13, and a battery temperature measurement unit 14. The voltage measurement unit 12 is connected between positive and negative electrode terminals of each of the storage battery cells C1 to Cn. The voltage measurement unit 12 measures an inter-terminal voltage of each of the storage battery cells C1 to Cn.

The current measurement unit 13 is provided in a current path of the storage battery pack 10. The current measurement unit 13 measures charge and discharge currents of the storage battery pack 10. In addition, the storage battery pack 10 is provided with the battery temperature measurement unit 14. The battery temperature measurement unit 14 measures a battery temperature of the storage battery pack 10.

The bypass circuit 20 includes n (n is an integer of 2 or more) bypass circuits B1 to Bn provided for the respective storage battery cells C1 to Cn. The bypass circuits B1 to Bn each include a bypass line BL and switches S1 and S2. The bypass line BL is a power line that bypasses each of the storage battery cells C1 to Cn. The switch S1 is provided to the bypass line BL. The switch S1 is, for example, a mechanical switch. The switch S2 is provided between a positive electrode of each of the storage battery cells C1 to Cn and one end of the bypass line BL. The switch S2 is, for example, a semiconductor switch.

The storage battery cell C1 at a start end is connected to the external system ES via the charging circuit 30, and the storage battery cell Cn at a terminal end is also connected to the external system ES. When the switch S1 is opened and the switch S2 is closed in all the bypass circuits B1 to Bn, all the storage battery cells C1 to Cn are connected in series to the external system ES and the charging circuit 30. On the other hand, when the switch S2 is opened and the switch S1 is closed in any of the bypass circuits B1 to Bn, the storage battery cells C1 to Cn corresponding to the bypass circuits B1 to Bn are bypassed.

The storage battery control device 100 is connected to the storage battery pack 10, the bypass circuit 20, and the charging circuit 30, and performs monitoring and control of each of the storage battery cells C1 to Cn, switching control of each of the bypass circuits B1 to Bn, and charging control by the charging circuit 30. The storage battery control device 100 in the first embodiment switches each of the bypass circuits B1 to Bn based on a remaining charge capacity RC until completion of charging of each of the storage battery cells C1 to Cn, and controls the charging of the storage battery pack 10 by the charging circuit 30. In the following description, the remaining charge capacity RC until completion of charging of each of the storage battery cells C1 to Cn is simply referred to as the remaining charge capacity RC. The remaining charge capacity RC is a capacity that can be charged until a charge termination voltage is reached at the time of charging each of the storage battery cells C1 to Cn, and is not a capacity that can be discharged to reach a discharge termination voltage of each of the storage battery cells C1 to Cn.

The storage battery control device 100 includes a measurement value acquisition unit 101, a remaining charge capacity calculation unit 102, a storage unit 103, a bypass control unit 104, and a charging control unit 105. The storage battery control device 100 may include a processor and a memory having instructions that, when executed by the processor, cause the storage battery control device 100 to perform operations including a first process and a second process to be described later by the measurement value acquisition unit 101, the remaining charge capacity calculation unit 102, the bypass control unit 104, and the charging control unit 105. The storage unit 103 is an example of the memory.

The measurement value acquisition unit 101 is connected to the voltage measurement unit 12, the current measurement unit 13, and the battery temperature measurement unit 14. The measurement value acquisition unit 101 acquires measurement values from the voltage measurement unit 12, the current measurement unit 13, and the battery temperature measurement unit 14, and stores the acquired measurement values in the storage unit 103.

The remaining charge capacity calculation unit 102 calculates the remaining charge capacity RC of each of the storage battery cells C1 to Cn based on the measurement values acquired by the measurement value acquisition unit 101, and stores the calculated value in the storage unit 103. The remaining charge capacity calculation unit 102 in the first embodiment calculates the remaining charge capacity RC [Ah] of each of the storage battery cells C1 to Cn using the following formula (1).

$$RC\ [Ah] = CC \times (100 - SOC)/100 \qquad (1)$$

Here, the CC is a current battery capacity (a current capacity [Ah] in the first embodiment) of each of the storage battery cells C1 to Cn, and is calculated by the remaining charge capacity calculation unit 102 using the following formula (2). The SOC is a state of charge (SOC) [%] of each of the storage battery cells C1 to Cn, and can be estimated using various known methods such as a current integration method, a method (voltage method) for obtaining the SOC from an open circuit voltage, and a method combining the current integration method and the voltage method.

$$CC\ [Ah] = C_0 \times SOH/100 \qquad (2)$$

Here, $C_0$ is a current capacity (Ah) of each of the storage battery cells C1 to Cn when the storage battery cells are new, and is stored in the storage unit 103. In addition, the SOH is a state of health (SOH) of each of the storage battery cells C1 to Cn, and is estimated by the remaining charge capacity calculation unit 102 based on the measurement values acquired by the measurement value acquisition unit 101.

As a method of calculating the SOH of each of the storage battery cells C1 to Cn, various known estimation methods using a change in the SOC over time or/and an increase in an internal resistance over time may be used. Examples of the estimation method of the SOH include: a method based on a charge and discharge test, a method based on a current integration method, a method based on measurement of an open circuit voltage, a method based on measurement of a terminal voltage, and a method based on a model (the above are methods using a change in the SOC over time); and a method based on alternating current impedance measurement, a method using an adaptive digital filter based on a model, a method based on linear regression (a slope of a straight line of I-V characteristics) from I-V characteristics (current-voltage characteristics), and a method based on a step response (the above are estimation methods using an increase in an internal resistance over time).

The storage unit 103 stores the measurement values acquired by the measurement value acquisition unit 101 and the calculated value of the remaining charge capacity RC of each of the storage battery cells C1 to Cn obtained by the remaining charge capacity calculation unit 102. In addition, the storage unit 103 stores a program executed by the storage battery control device 100.

The bypass control unit 104 controls opening and closing switching of the switches S1 and S2 of each of the bypass circuits B1 to Bn based on the remaining charge capacity RC of each of the storage battery cells C1 to Cn calculated by the remaining charge capacity calculation unit 102. Based on the remaining charge capacity RC of each of the storage battery cells C1 to Cn calculated by the remaining charge capacity calculation unit 102, the charging control unit 105 controls charging from the charging circuit 30 to the storage battery cells C1 to Cn connected in series.

Specifically, the bypass control unit 104 preferentially bypasses the storage battery cells C1 to Cn having a smaller remaining charge capacity RC than those of the other storage battery cells C1 to Cn by the bypass circuits B1 to Bn, and the charging control unit 105 charges the plurality of storage battery cells C1 to Cn connected in series such that a difference in the remaining charge capacities RC of the plurality of storage battery cells C1 to Cn is reduced (the first process). The charging control unit 105 controls charge amounts of the plurality of storage battery cells C1 to Cn connected in series such that the remaining charge capacities RC of all the storage battery cells C1 to Cn are equalized during the execution of the first process. Then, after the execution of the first process, the bypass control unit 104 connects all the storage battery cells C1 to Cn having the equalized remaining charge capacity RC by the bypass circuits B1 to Bn in series, and the charging control unit 105 charges all the storage battery cells C1 to Cn connected in series until the charging is completed (the second process).

The bypass control unit 104 opens the switch S2 and closes the switch S1 for each of the bypass circuits B1 to Bn corresponding to the storage battery cells C1 to Cn to be bypassed. On the other hand, the bypass control unit 104 opens the switch S1 and closes the switch S2 for each of the bypass circuits B1 to Bn corresponding to the storage battery cells C1 to Cn to be connected in series.

Figure 2:
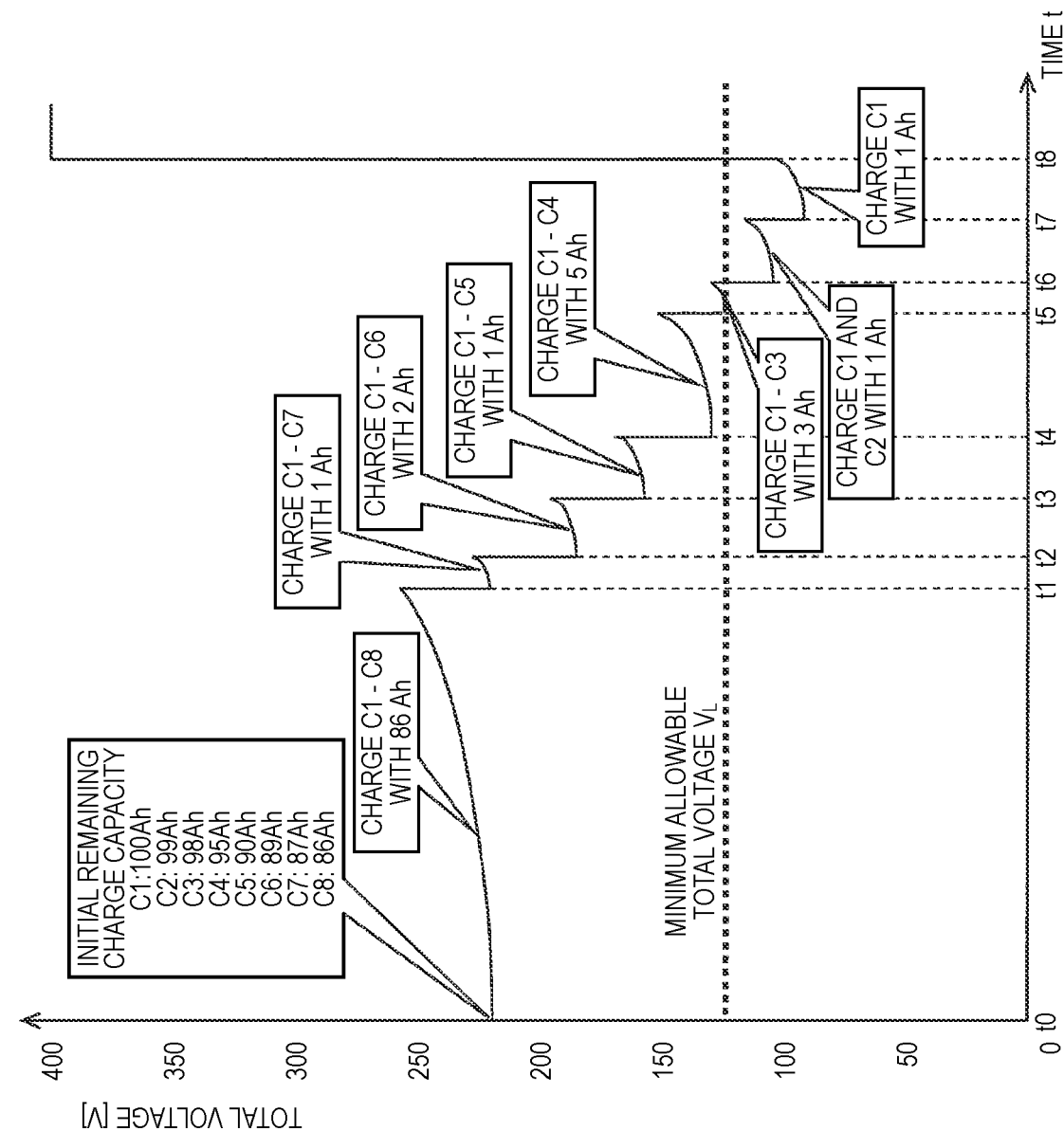
FIG. 2 is a timing chart illustrating charging control in a comparative example.

FIG. 2 is a timing chart illustrating charging control in a comparative example. In addition, FIG. 3 is a table illustrating the charging control in the comparative example shown in the timing chart of FIG. 2. As shown in these figures, in the charging control according to the comparative example, charging of eight storage battery cells C1 to C8 is controlled.

As shown in FIGS. 2 and 3, initial remaining charge capacities RC of the eight storage battery cells C1 to C8 are set to 100 [Ah], 99 [Ah], 98 [Ah], 95 [Ah], 90 [Ah], 89 [Ah], 87 [Ah], and 86 [Ah], respectively. In the charging control according to the comparative example, first, during a period from a time t0 to a time t1, a bypass control unit (not illustrated) connects the eight storage battery cells C1 to C8 in series, and a charging control unit (not illustrated) charges the eight storage battery cells C1 to C8 connected in series until any one of the remaining charge capacities RC is 0 [Ah]. Specifically, charge amounts of the eight storage battery cells C1 to C8 are set to 86 [Ah], and the storage battery cell C8 having a minimum initial remaining charge capacity RC of 86 [Ah] is fully charged.

Next, at the time t1, the bypass control unit bypasses the fully charged storage battery cell C8 by a bypass circuit B8, and brings the seven storage battery cells C1 to C7 into a state of being connected in series. During a period from the time t1 to a time t2, the charging control unit charges the seven storage battery cells C1 to C7 connected in series until any one of the remaining charge capacities RC is 0 [Ah]. Specifically, charge amounts of the seven storage battery cells C1 to C7 are set to 1 [Ah], and the storage battery cell C7 having a minimum remaining charge capacity RC of 1 [Ah] is fully charged.

Next, at the time t2, the bypass control unit bypasses the fully charged storage battery cell C7 by a bypass circuit B7, and brings the six storage battery cells C1 to C6 into a state of being connected in series. During a period from the time t2 to a time t3, the charging control unit charges the six storage battery cells C1 to C6 connected in series until any one of the remaining charge capacities RC is 0 [Ah]. Specifically, charge amounts of the six storage battery cells C1 to C6 are set to 2 [Ah], and the storage battery cell C6 having a minimum remaining charge capacity RC of 2 [Ah] is fully charged.

Next, at the time t3, the bypass control unit bypasses the fully charged storage battery cell C6 by a bypass circuit B6, and brings the five storage battery cells C1 to C5 into a state of being connected in series. During a period from the time t3 to a time t4, the charging control unit charges the five storage battery cells C1 to C5 connected in series until any one of the remaining charge capacities RC is 0 [Ah]. Specifically, charge amounts of the five storage battery cells C1 to C5 are set to 1 [Ah], and the storage battery cell C5 having a minimum remaining charge capacity RC of 1 [Ah] is fully charged.

Next, at the time t4, the bypass control unit bypasses the fully charged storage battery cell C5 by a bypass circuit B5, and brings the four storage battery cells C1 to C4 into a state of being connected in series. During a period from the time t4 to a time t5, the charging control unit charges the four storage battery cells C1 to C4 connected in series until any one of the remaining charge capacities RC is 0 [Ah]. Specifically, charge amounts of the four storage battery cells C1 to C4 are set to 5 [Ah], and the storage battery cell C4 having a minimum remaining charge capacity RC of 5 [Ah] is fully charged.

Next, at the time t5, the bypass control unit bypasses the fully charged storage battery cell C4 by a bypass circuit B4, and brings the three storage battery cells C1 to C3 into a state of being connected in series. During a period from the time t5 to a time t6, the charging control unit charges the three storage battery cells C1 to C3 connected in series until any one of the remaining charge capacities RC is 0 [Ah]. Specifically, charge amounts of the three storage battery cells C1 to C3 are set to 3 [Ah], and the storage battery cell C3 having a minimum remaining charge capacity RC of 3 [Ah] is fully charged.

Next, at the time t6, the bypass control unit bypasses the fully charged storage battery cell C3 by a bypass circuit B3, and brings the two storage battery cells C1 and C2 into a state of being connected in series. During a period from the time t6 to a time t7, the charging control unit charges the two storage battery cells C1 and C2 connected in series until any one of the remaining charge capacities RC is 0 [Ah]. Specifically, charge amounts of the two storage battery cells C1 and C2 are set to 1 [Ah], and the storage battery cell C2 having a minimum remaining charge capacity RC of 1 [Ah] is fully charged.

Finally, at the time t7, the bypass control unit bypasses the fully charged storage battery cell C2 by a bypass circuit B2, and brings the one storage battery cell C1 into a connected state. During a period from the time t7 to a time t8, the charging control unit charges the one storage battery cell C1 connected until the remaining charge capacity RC is 0 [Ah]. Specifically, a charge amount of the one storage battery cell C1 is set to 1 [Ah], and the storage battery cell C1 having the remaining charge capacity RC of 1 [Ah] is fully charged.

Here, from the viewpoint of ensuring operations of a load and the charging circuit, it is necessary to prevent a total voltage of the storage battery system from falling below a minimum allowable total voltage $V_L$ even during charging. The minimum allowable total voltage $V_L$ is set based on, for example, a specification of a charging circuit, and examples thereof include a minimum output voltage of AC/DC required for charging from a power system in a case of a grid-connected stationary storage battery system, and include a minimum output voltage of a regenerative power conversion circuit, an on-board charger (OBC), or the like in a case of an in-vehicle storage battery system.

However, in the charging control according to the comparative example, the total voltage of the storage battery system may fall below the minimum allowable total voltage $V_L$ at a time point when the number of the storage battery cells C1 to C8 connected in series is reduced to one or two. Therefore, in the charging control according to the first embodiment, the first process and the second process are executed such that a total voltage of the storage battery system 1 is maintained at the minimum allowable total voltage $V_L$ or higher from the start of charging to the completion of charging. Hereinafter, the charging control in the first embodiment will be described in detail.

Figure 4:
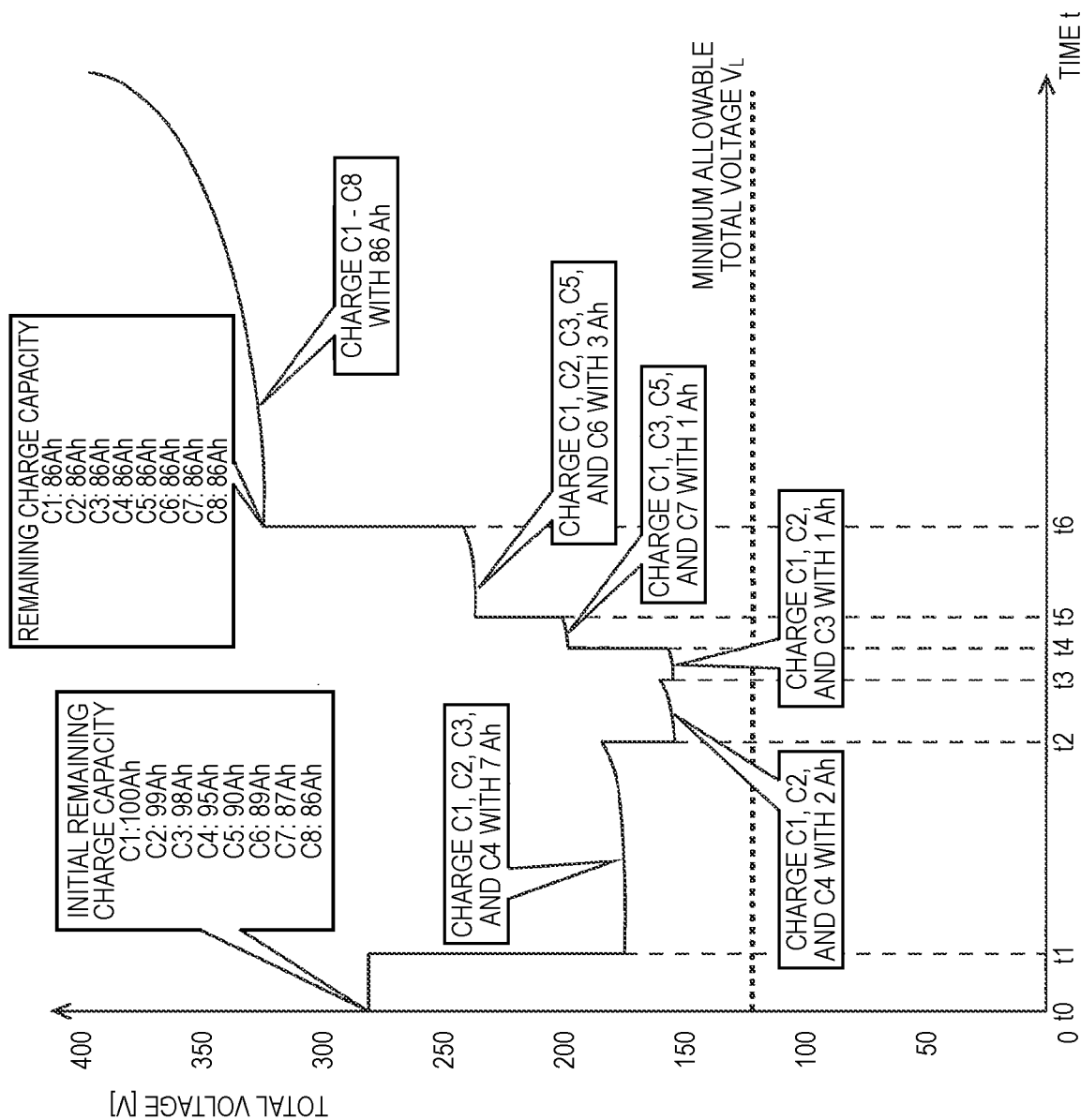
FIG. 4 is a timing chart illustrating charging control in the first embodiment of the present disclosure.

FIG. 4 is a timing chart illustrating the charging control in the first embodiment. In addition, FIG. 5 is a table illustrating the charging control in the first embodiment shown in the timing chart of FIG. 4. As shown in these figures, in the charging control according to the first embodiment, the charging of the eight storage battery cells C1 to C8 is controlled.

As shown in FIGS. 4 and 5, the initial remaining charge capacities RC of the eight storage battery cells C1 to C8 are set to 100 [Ah], 99 [Ah], 98 [Ah], 95 [Ah], 90 [Ah], 89 [Ah], 87 [Ah], and 86 [Ah], respectively. In the charging control according to the first embodiment, the bypass control unit 104 (see FIG. 1) preferentially bypasses the storage battery cells C1 to C8 having a relatively smaller remaining charge capacity RC than those of the other storage battery cells, and the charging control unit 105 (see FIG. 1) charges the plurality of storage battery cells C1 to Cn connected in series such that a difference in the remaining charge capacities RC of the plurality of storage battery cells C1 to Cn is reduced (the first process). In the first process, the bypass control unit 104 continuously bypasses a storage battery cell (C8 in an illustrated example) having a minimum initial remaining charge capacity RC from the start to the end of the process, and bypasses or connects in series the other storage battery cells (C1 to C7 in the illustrated example), thereby making the remaining charge capacities RC of all the storage battery cells C1 to C8 equal to a minimum value (86 Ah in the illustrated example) of the initial remaining charge capacity RC. In addition, in the first process, the bypass control unit 104 connects a storage battery cell (C1 in the illustrated example) having a maximum initial remaining charge capacity RC without bypassing the storage battery cell from the start to the end of the process, and connects or bypasses the other storage battery cells (C2 to C7 in the illustrated example) such that the number of times of bypass increases as the remaining charge capacity RC is reduced, thereby gradually reducing the difference in the remaining charge capacities RC. The first process here is an example, and may be changed as appropriate.

Here, in the first process, the bypass control unit 104 selects the storage battery cells C1 to C8 to be bypassed such that a condition that the total voltage of the storage battery system 1 is the minimum allowable total voltage $V_L$ or higher is satisfied. In the illustrated example, the bypass control unit 104 connects three or more storage battery cells C1 to C7 in series from the start to the end of the first process to maintain the total voltage of the storage battery system 1 to be higher than the minimum allowable total voltage $V_L$.

In the example of the first process shown in FIG. 4, first, at a time t1, the bypass control unit 104 bypasses the storage battery cells C5, C6, and C7 having a relatively smaller initial remaining charge capacity RC than those of the other storage battery cells in addition to the storage battery cell C8 having the minimum remaining charge capacity RC, and connects the storage battery cells C1, C2, C3, and C4 having a relatively larger initial remaining charge capacity RC than those of the other storage battery cells in series. During a period from the time t1 to a time t2, the charging control unit 105 charges the four storage battery cells C1 to C4 connected in series. A charge amount for the four storage battery cells C1 to C4 is 7 [Ah]. For example, the remaining charge capacity RC of the storage battery cell C4 may be reduced to a target value of 86 [Ah] by setting a charge amount for the four storage battery cells C1 to C4 to 9 [Ah].

Next, at the time t2, the bypass control unit 104 bypasses the storage battery cell C3 in addition to the storage battery cells C5 to C8, and connects the other storage battery cells C1, C2, and C4 in series. During a period from the time t2 to a time t3, the charging control unit 105 charges the three storage battery cells C1, C2, and C4 connected in series. A charge amount for the three storage battery cells C1, C2, and C4 is 2 [Ah]. Accordingly, the remaining charge capacity RC of the storage battery cell C4 is reduced to the target value of 86 [Ah].

Next, at the time t3, the bypass control unit 104 bypasses, together with the storage battery cells C5 to C8, the storage battery cell C4 whose remaining charge capacity RC is reduced to the target value, and connects the storage battery cell C3 that is bypassed. During a period from the time t3 to a time t4, the charging control unit 105 charges the three storage battery cells C1, C2, and C3 connected in series. A charge amount for the three storage battery cells C1, C2, and C3 is 1 [Ah].

Next, at the time t4, the bypass control unit 104 bypasses the storage battery cells C2 and C6 together with the storage battery cells C4 and C8 having the remaining charge capacity RC of the target value, and connects the storage battery cells C5 and C7 that are bypassed. During a period from the time t4 to a time t5, the charging control unit 105 charges the four storage battery cells C1, C3, C5, and C7 connected in series. A charge amount for the four storage battery cells C1, C3, C5, and C7 is 1 [Ah]. Accordingly, the remaining charge capacity RC of the storage battery cell C7 is reduced to the target value of 86 [Ah]. In addition, the remaining charge capacities RC of the storage battery cells C1, C2, C3, C5, and C6 are equal to 89 [Ah].

Next, at the time t5, the bypass control unit 104 bypasses the storage battery cells C4, C7, and C8 having the remaining charge capacity RC of the target value, and connects the storage battery cells C2 and C6 that are bypassed. During a period from the time t5 to a time t6, the charging control unit 105 charges the five storage battery cells C1, C2, C3, C5, and C6 connected in series. A charge amount for the five storage battery cells C1, C2, C3, C5, and C6 is 3 [Ah]. Accordingly, the remaining charge capacities RC of the storage battery cells C1, C2, C3, C5, and C6 are reduced to the target value of 86 [Ah], and the remaining charge capacities RC of all the storage battery cells C1 to C8 are equal to the target value of 86 [Ah].

Next, during a period from the time t6 to the completion of charging, the charging control unit 105 charges all the storage battery cells C1 to C8 connected in series (the second process). A charge amount for all the storage battery cells C1 to C8 in the second process is 86 [Ah]. Accordingly, all the storage battery cells C1 to C8 are fully charged.

As described above, instead of sequentially bypassing the storage battery cells C1 to Cn in which the charging is completed as in the comparative example, the storage battery control device 100 in the first embodiment executes the first process of preferentially bypassing the storage battery cells C1 to Cn having a relatively smaller remaining charge capacity RC than those of the other storage battery cells C1 to Cn by the bypass circuits B1 to Bn so as to reduce the difference in the remaining charge capacities RC of the plurality of storage battery cells C1 to Cn. Then, after the execution of the first process, the storage battery control device 100 connects all the storage battery cells C1 to Cn in series, and charges all the storage battery cells C1 to Cn until the charging is completed. Accordingly, a state in which all the storage battery cells C1 to Cn are connected in series can be maintained until the charging of all the storage battery cells C1 to C8 is completed after the execution of the first process. Therefore, during this period, the total voltage of the storage battery system 1 can be maintained to be higher than that in the comparative example. In addition, since the total voltage can be maintained in a high state, a period during which a desired charging power can be input from the charging circuit 30 to the storage battery pack 10 can be made longer than that in the comparative example.

In addition, in the first process, the storage battery control device 100 in the first embodiment reduces the remaining charge capacities RC of the plurality of storage battery cells C1 to Cn to a minimum value at a start point of the first process. Accordingly, charging completion timings of all the storage battery cells C1 to Cn can be equalized, and timings of bypassing the storage battery cells C1 to Cn in which the charging is completed can be equalized.

Further, the storage battery control device 100 in the first embodiment selects the storage battery cells C1 to Cn to be bypassed such that the total voltage of the storage battery system 1 during the execution of the first process is maintained at the minimum allowable total voltage $V_L$ or higher of the storage battery system 1. Accordingly, in the first process, the remaining charge capacities RC of the plurality of storage battery cells C1 to Cn can be equalized while preventing the total voltage of the storage battery system 1 from falling below the minimum allowable total voltage $V_L$ of the charging circuit 30 and a power system (not illustrated).

Figure 6:
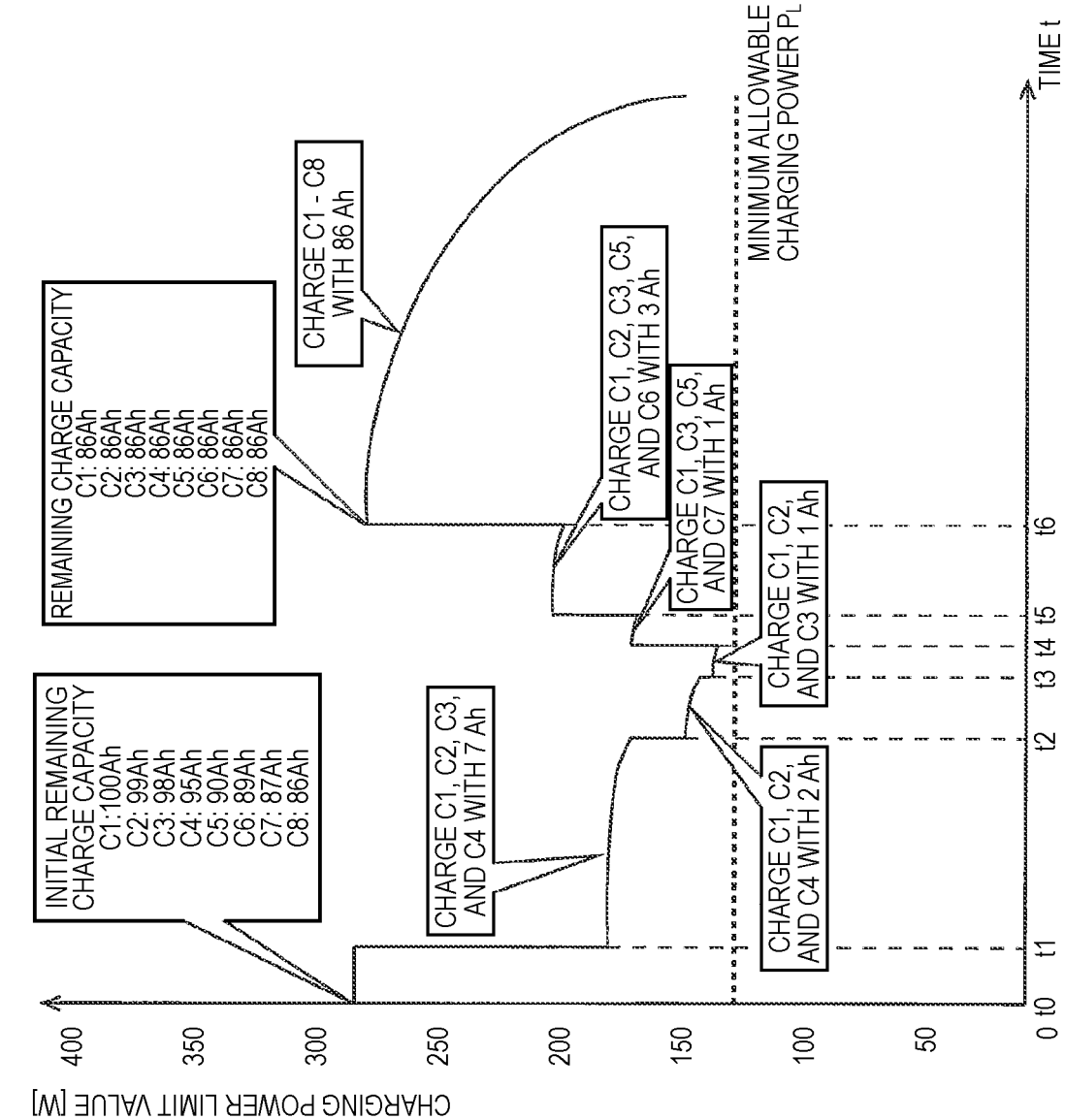
FIG. 6 is a timing chart illustrating charging control in a second embodiment of the present disclosure.

FIG. 6 is a timing chart illustrating charging control in a second embodiment. In the charging control shown in this figure, a charging power limit value [W] during execution of the first process is maintained at a minimum allowable charging power $P_L$ or higher. Here, the charging power limit value [W] is a value obtained by multiplying a minimum value among charging current limit values of the storage battery cells C1 to Cn by the total voltage of the storage battery system 1. In addition, the minimum allowable charging power $P_L$ is, for example, a lower limit value of a charging power allowed for the storage battery system 1 in order to guarantee a capability of constantly charging an upper limit power that can be generated by a photovoltaic power generation system.

The minimum allowable charging power $P_L$ may be a constant value or may be a value that varies depending on various conditions. For example, the minimum allowable charging power $P_L$ may be set to be high because a power generated by the photovoltaic power generation system is large in daytime on a sunny day, and the minimum allowable charging power $P_L$ may be set to be low because the power generated by the photovoltaic power generation system is small in the morning and evening, cloudy weather, and rainy weather.

Although the present disclosure has been described based on the embodiments, the present disclosure is not limited to the embodiments described above. The present disclosure may be modified as appropriate without departing from the gist of the present disclosure, or known and well-known techniques may be combined as appropriate.

For example, in the embodiments described above, the remaining charge amount of each of the storage battery cells C1 to Cn until completion of charging is specified by the remaining charge capacity RC [Ah] which is the current capacity. However, the remaining charge amount of each of the storage battery cells C1 to Cn until completion of charging may be specified by one correlating with the index, and may be specified by SOC, OCV (the open circuit voltage), or the like.

In addition, in the embodiments described above, in the first process, the remaining charge capacities RC of the plurality of storage battery cells C1 to Cn are reduced to the minimum value at the start point of the first process. However, the remaining charge capacities RC of the plurality of storage battery cells C1 to Cn may be reduced to a value below the minimum value at the start point of the first process.

Further, from the viewpoints of finally using up the remaining charge capacities RC of all the storage battery cells C1 to Cn and equalizing the charging completion timings of all the storage battery cells C1 to Cn, it is preferable to equalize the remaining charge capacities RC of the plurality of storage battery cells C1 to Cn in the first process. However, in the first process, it is not essential to equalize the remaining charge capacities RC of the plurality of storage battery cells C1 to Cn, and it is sufficient that the difference in the remaining charge capacities RC of the plurality of storage battery cells C1 to Cn is reduced in the first process.

Further, the first process may be executed so as to satisfy one of a condition in the first embodiment in which the total voltage of the storage battery system 1 during the execution of the first process is maintained at the minimum allowable total voltage $V_L$ or higher, and a condition in the second embodiment in which the charging power limit value [W] during the execution of the first process is maintained at the minimum allowable charging power $P_L$ or higher, or may be executed so as to satisfy both of the conditions. That is, the first process may be executed such that at least one of the total voltage value of the storage battery system 1 during the execution of the first process and the charging power limit value during the execution of the first process is maintained at the minimum allowable value allowed for the storage battery system 1 or higher.

The invention claimed is:

1. A storage battery control device configured to control a storage battery system, the storage battery system comprising a plurality of storage batteries connected in series and a bypass circuit configured to selectively bypass each of the plurality of storage batteries, the storage battery control device comprising:
   a processor; and
   a memory having instructions that, when executed by the processor, cause the storage battery control device to perform operations comprising:
      performing a first process of causing the bypass circuit to preferentially bypass, among the plurality of storage batteries, a storage battery having a smaller remaining charge amount until completion of charging than those of the other storage batteries, and charging at least one of the plurality of storage batteries such that a difference in remaining charge amounts of the plurality of storage batteries until completion of charging is reduced; and
      performing, after the first process, a second process of charging the plurality of storage batteries until the charging is completed.

2. The storage battery control device according to claim 1, wherein the first process comprises charging the at least one of the plurality of storage batteries such that the remaining charge amounts of the plurality of storage batteries are reduced to a minimum value or less of the remaining charge amounts of the plurality of storage batteries at a start point of the first process.

3. The storage battery control device according to claim 1, wherein the first process is performed such that at least one of a total voltage value of the storage battery system during execution of the first process and a charging power limit value during the execution of the first process is maintained at a minimum allowable value allowed for the storage battery system or higher.

4. A storage battery system comprising:
   a plurality of storage batteries connected in series;
   a bypass circuit configured to selectively bypass each of the plurality of storage batteries; and
   a storage battery control device configured to control the bypass circuit,
   wherein the storage battery control device comprises:
   a processor; and
   a memory having instructions that, when executed by the processor, cause the storage battery control device to perform operations comprising:
      performing a first process of causing the bypass circuit to preferentially bypass, among the plurality of storage batteries, a storage battery having a smaller remaining charge amount until completion of charging than those of the other storage batteries, and charging at least one of the plurality of storage batteries such that a difference in remaining charge amounts of the plurality of storage batteries until completion of charging is reduced; and
      performing, after the first process, a second process of charging the plurality of storage batteries until the charging is completed.

5. A storage battery control method to be executed by using a storage battery control device, the storage battery control device being configured to control a storage battery system comprising a plurality of storage batteries connected in series and a bypass circuit configured to selectively bypass each of the plurality of storage batteries, the storage battery control method comprising:
   performing a first process of causing the bypass circuit to preferentially bypass, among the plurality of storage batteries, a storage battery having a smaller remaining charge amount until completion of charging than those of the other storage batteries, and charging at least one of the plurality of storage batteries such that a difference in remaining charge amounts of the plurality of storage batteries until completion of charging is reduced; and
   performing, after the first process, a second process of charging the plurality of storage batteries until the charging is completed.

* * * * *